United States Patent [19]

Mattauch et al.

[11] 4,373,989
[45] Feb. 15, 1983

[54] CONTROLLED IN SITU ETCH-BACK

[76] Inventors: James M. Beggs, Administrator of the National Aeronautics and Space Administration, with respect to an invention of Robert J. Mattauch, Charlottesville, Va.; Alan C. Seabaugh, Olney, Md.

[21] Appl. No.: 325,933

[22] Filed: Nov. 30, 1981

[51] Int. Cl.³ .......................................... H01L 21/306
[52] U.S. Cl. .................................... 156/635; 148/173; 148/175; 156/608; 156/624; 156/654; 156/662
[58] Field of Search ............................ 148/171–173, 148/1.5, 175; 156/600, 608, 617 R, 616 A, 618, 621, 622, 624, DIG. 70, DIG. 98, DIG. 111, 635, 662, 345, 654; 427/82; 252/79.1

[56] References Cited

U.S. PATENT DOCUMENTS

| | | | |
|---|---|---|---|
| 3,692,593 | 9/1972 | Hawrylo et al. | 148/172 |
| 3,753,801 | 8/1973 | Lockwood et al. | 148/171 |
| 3,859,178 | 1/1975 | Logan et al. | 204/15 |
| 3,891,478 | 6/1975 | Ladany et al. | 148/173 X |
| 3,960,618 | 6/1976 | Kawamura et al. | 148/171 |

*Primary Examiner*—William A. Powell
*Attorney, Agent, or Firm*—P. McCaul; J. Manning

[57] ABSTRACT

A controlled in situ etch-back technique is disclosed in which an etch melt 17 and a growth melt 18 are first saturated by a source-seed crystal 15 and thereafter etch-back of a substrate 14 takes place by the slightly undersaturated etch melt, followed by LPE growth of a layer by the growth melt, which is slightly supersaturated.

19 Claims, 2 Drawing Figures

CONTROLLED IN SITU ETCH-BACK

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

THE FIELD OF THE INVENTION

The present invention generally relates to liquid phase epitaxy (LPE) growth of layers and, more particularly, to a process for the controlled removal of a surface layer at the interface between a substrate and a layer which is grown epitaxially, by in situ etch-back.

DESCRIPTION OF THE PRIOR ART

In liquid-phase growth of n on n+ epitaxial layers of semiconductors e.g. GaAs, a high resistivity layer often forms during the high temperature (e.g. 700°-800° C.) melt equilibrium period, prior to growth. Similar high resistivity layer formation has occured in vapor phase epitaxy (VPE) of n on n+ layers. An anomalous p-type conducting layer has also been observed in both LPE and VPE growth on a semi-insulating substrate material.

Various techniques have been proposed for in situ surface layer removal, prior to LPE growth. These techniques are often referred to as in situ etch-back, for etching back the substrate inside the growth furnace just prior to LPE growth. The most common technique is to use two melts: a pure etch melt for the etch-back and a saturated melt for the growth. Prior to growth the substrate is moved under the pure etch melt where it etches at a known rate e.g. 100 μm/min at 750° C. for Ga. Unless the melt is replaced after each etchback, the etch rate decreases as the etch melt becomes more and more nearly saturated.

Another common technique is to perform the etch-back and growth in the same melt. Etching is instigated by either raising the temperature of a saturated melt, with the substrate still in contact, or by sliding the substrate under a partially undersaturated melt. The melt is then cooled and growth initiated as the melt temperature decreases below its saturation point. Generally, poorer surface morphology results from this techinque in comparison with the technique in which two separate pure melts are used. In either one of these techniques the depth of etching and therefore the extent of layer removed is not easily controlled, since the rate of etching is variable as in the above method or very rapid as in the case of the pure gallium melt.

SUMMARY OF THE INVENTION

The present invention is directed to an in situ etch-back process to remove the high resistivity or unwanted surface layer in a controlled manner just prior to the growth of an epitaxial layer, i.e. the total layer thickness which is to be removed can be measured and the etch rate calibrated. The process requires two melts, an etch melt and a growth melt. Initially, the etch melt saturation is established at a temperature $\Delta T$, below the growth melt saturation temperature. Just prior to growth, with the growth melt at its saturation temperature, the substrate is moved under the $\overline{\Delta T}$ undersaturated etch melt, where a previously predetermined (by calibration) amount of the substrate surface is dissolved. After the desired etch-back, the substrate is moved directly to the growth melt and an epitaxial layer is grown, from a slightly supersaturated growth melt.

The novel features of the invention are set forth with particularity in the appended claims. The invention will be best understood from the following description when read in conjunction with the accompanying drawings.

DETAILED DESCRIPTION OF THE DRAWINGS

Figure 1:
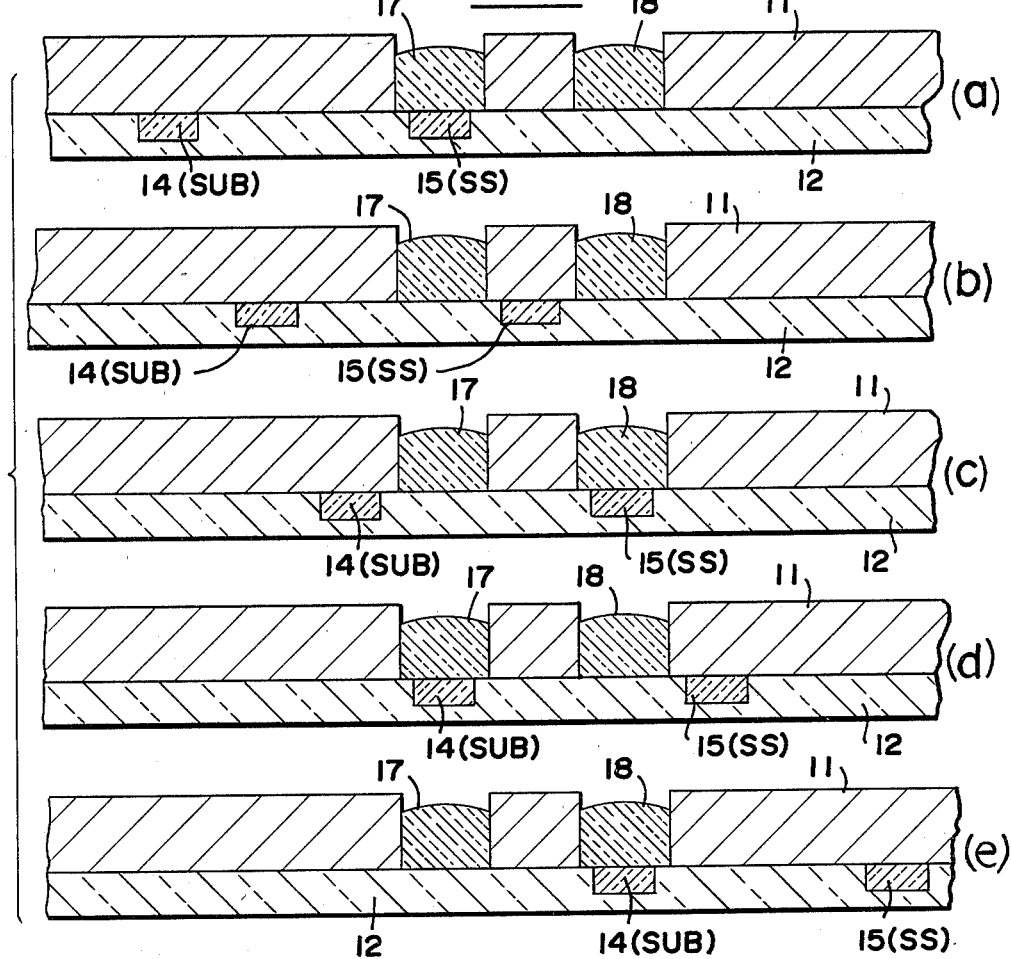
FIG. 1 is a multiline diagram of a boat and slider in a reactor in different relative positions, useful in explaining the steps of the inventive process.

In the following description, the invention will be described in connection with epitaxially growing a layer of GaAs on a GaAs substrate. However, as will become apparent, the invention is not limited thereto.

The various steps of the process of the invention are performed inside a standard LPE reactor. In lines a-e of FIG. 1, to which reference is made, the reactor's boat 11 and slider 12 are shown in different relative positions, as a function of the steps of the process to be described. The slider is assumed to contain a GaAs source-seed (SS) crystal 15 and a GaAs substrate (SUB) 14, while the boat contains two melts—an etch melt 17 and a growth melt 18.

Initially, the slider is loaded with SS 15 and the SUB 14 and the boat is loaded with melts 17 and 18. Then a standard bakeout of the reactor takes place in a flowing hydrogen ambient. For the case of a bakeout temperature different from the melt saturation temperature, the temperature of the reactor is then changed to the saturation temperature of the etch melt 17, herein defined as $T_{es}$, where the subscript es designates "etch saturation". In one case, $T_{es} = 745°$ C. $T_{es}$ is $\Delta T$ below the saturation temperature of the growth melt, defined as $T_{gs}$. Thus, $T_{gs} - T_{es} = \Delta T$.

After baking out and adjusting the reactor to the etch melt saturation temperature, $T_{es}$, the source-seed 15 is moved under the etch melt 17, as shown in FIG. 1 line 'a'. After a saturation period of approximately one hour, the bottom of the etch melt 17 is fully saturated. Then the source-seed 15 is moved from under the etch melt, as shown in line b, and the reactor temperature is set to increase by $\Delta T$ i.e. to the saturation temperature of the growth melt, $T_{gs}$. When the temperature has increased approximately one-half degree Celsius, the slider 12 is moved to position the source-seed 15 under the growth melt 18, as shown in FIG. 1 line c. At this position and temperature ($T_{gs}$) the growth melt 18 is saturated by the source-seed 15 for approximately one hour. Then cooling is initiated, with the source-seed 15 still in contact with the growth melt 18, as shown in line c.

At a temperature $T_e$ (the temperature at which etching occurs) roughly 1.5°-2° C. lower than $T_{gs}$, which in our case was 752° C., i.e. at about 750°-750.5° C. the slider 12 is moved to position the substrate 14 under the etch melt 17, as shown in line d. It should be pointed out that at this temperature range, i.e. 750°-750.5° C. the etch melt 17 is slightly undersaturated, having been previously saturated at 745° C. while the growth melt 18 is slightly supersaturated, having been previously saturated at 752° C.

With the substrate 14 under the undersaturated etch melt 17 (line d) in situ etch-back of the substrate takes place. Such etch-back takes place under controlled conditions, based on the prior determination of etch-back depth versus time.

Figure 2:
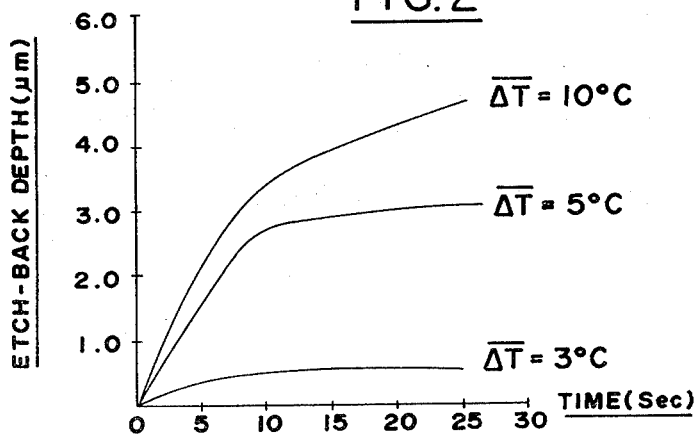
FIG. 2 is a two-dimensional diagram of etch-back depth vs time, useful in further explaining the invention.

This aspect may better be appreciated by referring to FIG. 2 which is a diagram of etch-back depth in $\mu$m vs. time in seconds, for several values of etch melt undersaturation temperature $\Delta \overline{T}$ (where $\Delta \overline{T} = T_e - T_{es}$). As can be seen from FIG. 2, with $\Delta \overline{T} = 5°$ C., i.e. with the etch melt saturation temperature at 745° C., when the substrate is etched back by the undersaturated etch melt at a temperature of a few degrees above the etch melt e.g. 750°–750.5° C., the etch-back rate is initially very great, roughly 0.3 $\mu$m/sec, and then it tapers off to less than 0.01 $\mu$m/sec.

Thus, by knowing the etch-back depth vs. time and the thickness of the desired layer which is to be etched back, the etch-back condition, such as time, as be controlled to remove only the desired surface layer. In our example, an etch-back of roughly 1.5 $\mu$m is typically sufficient to remove all electrical surface damage, such as the high resistivity layer. That is, with $T_{es} = 745$ and $T_e = 750°$ C., $\Delta T = 5°$ C. Thus, the in situ etch-back controllably removes roughly 1.5 $\mu$m of the substrate surface in about 5–6 seconds.

Once the etch-back has taken place (see line d) the slider 12 is moved quickly to position the etched substrate 14 under the growth melt 18, as shown in line e of FIG. 1, to produce the epitaxial growth of a layer on the etched substrate by the slightly supersaturated growth melt 17, which has become supersaturated during the etch-back time.

In summary, in accordance with the present invention, a source-seed crystal is used to saturate an etch melt and a growth melt at selected temperatures $T_{es}$ and $T_{gs}$ respectively, where $T_{gs} - T_{es} = \Delta T$ and etching takes place at temperature $T_e$. With $T_{es}$ and $T_e (\Delta \overline{T} = T_e - T_{es})$ fixed, the etch-back depth vs. time can be determined experimentally as shown in FIG. 2, for the specific value of $\Delta \overline{T}$. Based thereon and with a knowledge of the layer thickness to be removed, the substrate etch-back takes place under controlled conditions to a predetermined depth thus removing only the undesired layer. Once the layer is removed, a desired layer is epitaxially grown on the etched substrate from a slightly supersaturated growth melt.

Since the saturation of the etch melt and the growth melt are trimmed by the source-seed crystal prior to each growth, the reproducibility of the etch-back is ensured. Also, since the etch melt is separate from the growth melt, "melt memory" problems are alleviated. That is, the purity of the regrown layer is not a function of the layer previously etched off. Furthermore, by selecting $\Delta \overline{T}$ i.e. $T_e - T_{es}$ to be greater than one quarter degree Celsius, problems of poor surface morphology are alleviated.

In the foregoing, the invention has been described in connection with a process which was actually performed in connection with a reactor with a large thermal mass. As is appreciated, the temperature of such a reactor can not be changed abruptly. It is for this reason that the temperature of the reactor was ramped up from $T_{es} = 745°$ C. to $T_{gs} = 752°$ C. during which the growth melt was saturated. Thereafter, the temperature was ramped down toward the desired etching temperature $T_e$, which in the particular example was about 750° C. to 750.5° C. i.e. about 1½ to 2 degrees C below the growth melt saturation temperature and 5 degrees above $T_e$. After the etching period, the growth of a layer on the substrate took place. Since the growth took place with a supersaturated growth melt at a temperature of about two degrees below the growth saturation temperature of 752° C., as previously pointed out, the source-seed 15 remained in contact with the growth melt until just prior to the initiation of the etching, producing some growth on the source-seed.

If desired, the process may be performed with a reactor of relatively low thermal mass. The temperatures of such a reactor can be varied more rapidly than in the case of a high thermal mass reactor. Thus, with a low thermal mass reactor and particularly one in which the temperature can be stepped accurately from one value to another, the growth melt need not be saturated several degrees above the etching and layer growth temperature. Rather, the growth saturation temperature $T_{gs}$ can be only a fraction of a degree above the etching temperature $T_e$ and particularly the layer growth temperature, so that the layer is grown from a slightly supersaturated growth melt.

For example, the growth melt may be saturated at a temperature which is only slightly above the etching temperature $T_e$ by a quarter or half a degree Celsius. Then the temperature would be quickly lowered to $T_e$ and etching performed followed by the growth of the desired layer. Since the growth melt was saturated at a temperature slightly above $T_e$, the growth will take place from a slightly supersaturated growth melt, which is highly desirable. Also if desired, the growth melt may be saturated at the etching temperature i.e. $T_{gs} = T_e$. Then as etching takes place, the reactor temperature may be permitted to ramp down by a fraction of a degree Celsius, so that when layer growth takes place, it is with a slightly supersaturated growth melt.

Although the invention has been described that the conjunction with GaAs, it should be appreciated that the inventive process is not limited thereto. It can be used for etching and epitaxially growing other materials. Although particular steps of the invention have been described and illustrated herein, it is recognized that modifications and variations may readily occur to those skilled in the art and consequently, it is intended that the claims be interpreted to cover such modifications and equivalents.

What is claimed is:

1. A method of etching back the top surface of a substrate with an etch melt, the substrate being one on which a layer of matter is to be grown epitaxially from a growth melt, the steps comprising:

saturating the etch melt at a temperature, definable as $T_{es}$;

saturating the growth melt at a temperature, definable as $T_{gs}$ which is greater than $T_{es}$;

exposing the substrate to the etch melt at a temperature definable as $T_e$, where $T_{gs} > T_e > T_{es}$ for a selected period, $T_e$ being a temperature at which the depth of etching vs. time of the substrate by the etch melt, saturated at $T_{es}$ is known; and after said selected period exposing said substrate to said growth melt, to grow a layer thereon.

2. A method of etching back the top surface of a substrate as recited in claim 1 wherein $T_e$ is greater than $T_{es}$ by more than one degree Celsius.

3. A method of etching back the top surface of a substrate as recited in claim 1 wherein said etch melt and said growth melt are saturated at the temperatures, $T_{es}$ and $T_{gs}$ respectively, with a source-seed crystal.

4. A method of etching back the top surface of a substrate as recited in claim 3 wherein said substrate is GaAs, said growth melt is composed of Ga and As, and said etch melt contains matter for etching the surface of a GaAs substrate.

5. A method of etching back the top surface of a substrate as recited in claim 4 wherein said etch melt and said growth melt are saturated at the temperatures $T_{es}$ and $T_{gs}$ respectively, with a source-seed crystal of GaAs.

6. A method of etching back the top surface of a substrate as recited in claim 5 where $T_e - T_{es} > \frac{1}{4}°$ C.

7. A method of etching back the top surface of a substrate as recited in claim 6 wherein $T_e - T_{es} = \Delta T$ being on the order of 7° C.

8. A method of etching back the top surface of a substrate as recited in claim 7 wherein $T_{gs}$ is on the order of 752° C. and $T_{es}$ is on the order of 745° C.

9. A method of etching back the top surface of a substrate as recited in claim 8 wherein $T_e$ is on the order of one-and-one-half to two degrees Celsius below $T_{gs}$.

10. A method of etching a substrate prior to growing epitaxially a layer of matter thereon, in a liquid phase epitaxial (LPE) furnace of the type including a boat with a plurality of spaced apart wells, and a slider adapted to slide with respect to said boat to form the bottom of said wells, said slider including recesses, the steps comprising:

providing an etch melt and a growth melt in two spaced apart wells in said boat;

providing a source-seed crystal and a substrate in two spaced apart recesses in said slider;

heating said furnace to a temperature definable as $T_{es}$ with the slider positioned so that said source-seed crystal is in contact with the etch melt;

saturating said etch melt with said source-seed crystal at $T_{es}$;

sliding said slider so that neither said source-seed crystal nor said substrate is in contact with either of said melts;

raising said furnace temperature to a temperature $T_{gs}$ where $T_{gs} > T_{es}$;

sliding said slider so that said source-seed crystal is in contact with said growth melt until said growth melt is saturated;

lowering the furnace temperature to a temperature definable at $T_e$ where $T_{gs} > T_e > T_{es}$.

sliding said slider to position said substrate under said etch melt for a selected period of time, based on a predetermined etch depth vs. time of said melt at $T_e$, after having been saturated at $T_{es}$, to etch said substrate to a selected depth; and sliding said slider to position said etched substrate under said growth melt which was previously saturated at $T_{gs}$ to grow a layer of matter thereon.

11. A method of etching a substrate as recited in claim 10 wherein $T_e$ is greater than $T_{es}$ by more than one greater degree Celsius.

12. A method of etching a substrate as recited in claim 10 wherein said substrate, said source-seed crystal and said growth melt are GaAs and said etch melt contains matter for etching a GaAs substrate.

13. A method of etching a substrate as recited in claim 12 where $T_e - T_{es} = \Delta T > \frac{1}{4}°$ C.

14. A method of etching a substrate as recited in claim 13 wherein $\Delta T = T_{gs} - T_{es}$, $\Delta T$ being on the order of 7° C.

15. A method of etching a substrate as recited in claim 14 where $T_{gs}$ is on the order of 752° C. and $T_{es}$ is on the order of 745° C.

16. A method of etching a substrate as recited in claim 15 where $T_e$ is on the order of one-and-one-half to two degrees Celsius below $T_{gs}$.

17. A method of etching a substrate prior to growing epitaxially a layer of matter thereon, in a liquid phase epitaxial (LPE) furnace of the type including a boat with a plurality of spaced apart wells, and a slider adapted to slide with respect to said boat to form the bottom of said wells, said slider including recesses, the steps comprising:

providing an etch melt and a growth melt in two spaced apart wells in said boat;

providing a source-seed crystal and a substrate in two spaced apart recesses in said slider;

heating said furnace to a temperature definable as $T_{es}$ with the slider positioned so that said source-seed crystal is in contact with the etch melt;

saturating said etch melt with said source-seed crystal at $T_{es}$;

sliding said slider so that neither said source-seed crystal nor said substrate is in contact with either of said melts;

raising said furnace temperature to a temperature $T_{gs}$ where $T_{gs} > T_{es}$;

sliding said slider so that said source-seed crystal is in contact with said growth melt until said growth melt is saturated;

at a furnace temperature of $T_e$, where $T_{gs} \geq T_e$ sliding said slider to position said substrate under said etch melt for a selected period of time, based in a predetermined etch depth vs. time of said etch melt at $T_e$, after having been saturated at $T_{es}$, to etch said substrate to a selected depth; and at a temperature $T_x$, where $T_{gs} > T_x$ sliding said slider to position said etched substrate under said growth melt which was previously saturated at $T_{gs}$ to grow a layer of matter thereon, from the supersaturated growth melt.

18. A method of etching a substrate as recited in claim 17 wherein $T_e = T_{gs}$ and $T_x$ is less than $T_e$ by less than one degree Celsius.

19. A method of etching a substrate as recited in claim 17 wherein $T_{gs} \geq T_e$ and, $T_e \geq T_x$, $T_e > T_{es}$ and $T_{gs} - T_x$ is not more than one degree Celsius.

* * * * *